US010909729B2

(12) United States Patent
Yui et al.

(10) Patent No.: US 10,909,729 B2
(45) Date of Patent: Feb. 2, 2021

(54) IMAGE PROCESSING APPARATUS

(71) Applicant: Toshiba Medical Systems Corporation, Otawara (JP)

(72) Inventors: Masao Yui, Otawara (JP); Ryo Shiroishi, Nasushiobara (JP); Tsutomu Kato, Niihama (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 36 days.

(21) Appl. No.: 15/680,305

(22) Filed: Aug. 18, 2017

(65) Prior Publication Data
US 2018/0068469 A1  Mar. 8, 2018

(30) Foreign Application Priority Data

Sep. 2, 2016  (JP) .................. 2016-172329

(51) Int. Cl.
G06T 11/00 (2006.01)
G06T 7/11 (2017.01)
(Continued)

(52) U.S. Cl.
CPC ........ G06T 11/006 (2013.01); G01R 33/5602 (2013.01); G06T 7/11 (2017.01);
(Continued)

(58) Field of Classification Search
CPC .............. G01R 33/546; G01R 33/5602; G01R 33/5607; G06T 5/50; G06T 7/11;
(Continued)

(56) References Cited

U.S. PATENT DOCUMENTS 5,814,991 A * 9/1998 Deimling ............... G01R 33/50
324/309
8,874,189 B2  10/2014 Warntjes
(Continued)

FOREIGN PATENT DOCUMENTS

JP  63-317144 A  12/1988
JP  10-33504 A  2/1998

OTHER PUBLICATIONS

Hagiwara, Akifumi, et al. "Contrast-enhanced synthetic MRI for the detection of brain metastases." Acta radiologica open5.2 Feb. 2016 (Year: 2016).*

(Continued)

Primary Examiner — Katrina R Fujita
(74) Attorney, Agent, or Firm — Oblon, McClelland, Maier & Neustadt, L.L.P.

(57) ABSTRACT

An image processing apparatus according to an embodiment includes a processing circuitry. The processing circuitry is configured to generate a first calculated image and a second calculated image through calculation using data obtained through an imaging in which magnetic resonance signals used for deriving a tissue quantitative value are acquired, wherein a signal value of a tissue other than a suppression-target tissue which is a target to be suppressed is low on the second calculated image as compared to the first calculated image. The processing circuitry is configured to generate a difference image between the first calculated image and second calculated image so as to generate an image on which a signal value of a tissue with a long relaxation time is suppressed.

11 Claims, 9 Drawing Sheets

(51) Int. Cl.
*G06T 7/174* (2017.01)
*G01R 33/56* (2006.01)

(52) U.S. Cl.
CPC .... *G06T 7/174* (2017.01); *G06T 2207/10088* (2013.01); *G06T 2207/20224* (2013.01); *G06T 2207/30016* (2013.01)

(58) Field of Classification Search
CPC ............... G06T 7/174; G06T 11/006; G06T 2207/10088; G06T 2207/20224; G06T 2207/30016
See application file for complete search history.

(56) References Cited

U.S. PATENT DOCUMENTS

| | | | | |
|---|---|---|---|---|
| 2002/0183612 | A1* | 12/2002 | Deimling | G01R 33/56 600/410 |
| 2012/0262169 | A1* | 10/2012 | Madhuranthakam | G01R 33/4616 324/309 |
| 2012/0262175 | A1* | 10/2012 | Alsop | G01R 33/5607 324/314 |
| 2016/0202338 | A1* | 7/2016 | Kimura | G01R 33/56341 324/309 |

OTHER PUBLICATIONS

Gulani et al. "Towards a single-sequence neurologic magnetic resonance imaging examination: multiple-contrast images from an IR TrueFISP experiment." Investigative radiology 39.12 (2004): 767-774. (Year: 2004).*

Stephen J. Riederer, et al., "Automated MR Image Synthesis: Feasibility Studies," 1984, Radiology 153, pp. 203-206.

Dan Ma, et al., "Magnetic Resonance Fingerprinting," Sep. 14, 2013, Nature, pp. 1-19.

J. B. M. Warntjes, et al., "Rapid Magnetic Resonance Quantification on the Brain: Optimization for Clinical Usage," 2008, Magnetic Resonance in Medicine 60, pp. 320-329.

Japanese Office Action dated Jun. 16, 2020 in Patent Application No. 2016-172329 (with English translation), 3 pages.

* cited by examiner

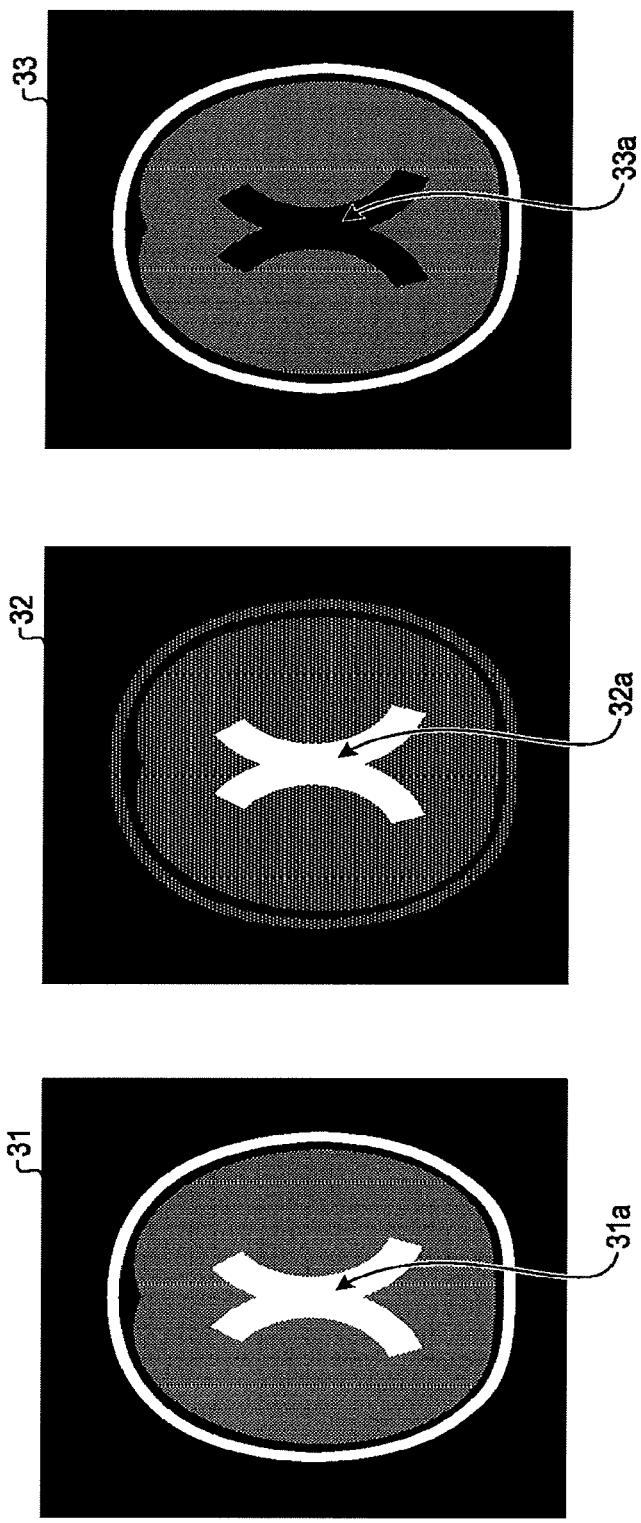

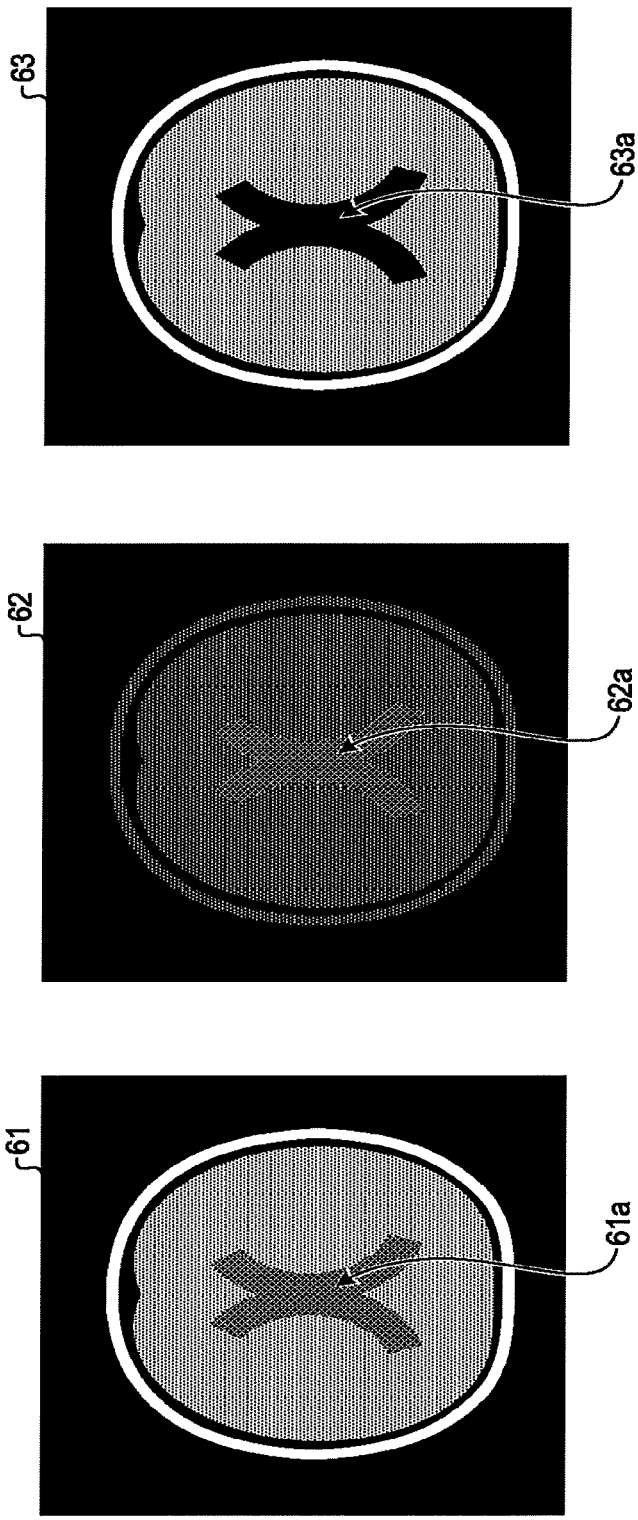

IMAGE PROCESSING APPARATUS

CROSS-REFERENCE TO RELATED APPLICATIONS

This application is based upon and claims the benefit of priority from Japanese Patent Application No. 2016-172329, filed on Sep. 2, 2016; the entire contents of which are incorporated herein by reference.

FIELD

Embodiments described herein relate generally to an image processing apparatus.

BACKGROUND

There is a conventionally known technology to generate images with any contrast through calculation after imaging by using data that is acquired from the subject by a magnetic resonance imaging (MRI) apparatus. For example, the technology called Synthetic MRI or the technology called MR fingerprinting is known. According to the technology, for example, it is possible generate images where the signal value of a specific tissue is suppressed, for example, fluid attenuated inversion recovery (FLAIR) images where the signal value of a tissue with a lot of water components, such as cerebrospinal fluid (CSF), is suppressed.

BRIEF DESCRIPTION OF THE DRAWINGS

FIG. 3 is a diagram that illustrates an example of generation of a difference image by a second generation function according to the first embodiment;

FIG. 6 is a diagram that illustrates an example of generation of a difference image by the second generation function according to the first modification of the first embodiment;

DETAILED DESCRIPTION

An image processing apparatus according to an embodiment includes a processing circuitry. The processing circuitry is configured to generate a first calculated image and a second calculated image through calculation using data obtained through an imaging in which magnetic resonance signals used for deriving a tissue quantitative value are acquired, wherein a signal value of a tissue other than a suppression-target tissue which is a target to be suppressed is low on the second calculated image as compared to the first calculated image. The processing circuitry is configured to generate a difference image between the first calculated image and the second calculated image so as to generate an image on which a signal value of a tissue with a long relaxation time is suppressed.

First Embodiment

Figure 1:
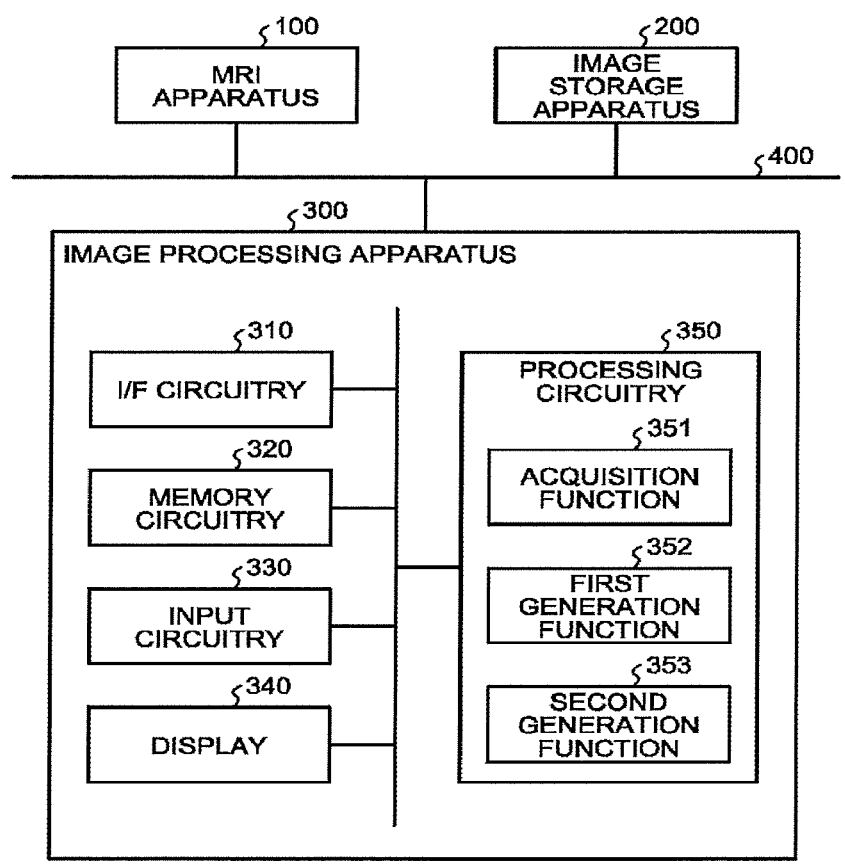
FIG. 1 is a diagram that illustrates an example of the configuration of an image processing apparatus according to a first embodiment.

FIG. 1 is a diagram that illustrates an example of the configuration of an image processing apparatus according to a first embodiment. For example, as illustrated in FIG. 1, an image processing apparatus 300 according to the present embodiment is connected to an MRI apparatus 100 and an image storage apparatus 200 via a network 400.

The MRI apparatus 100 uses the magnetic resonance phenomenon to acquire image data on the subject. Specifically, the MRI apparatus 100 conducts various imaging sequences in accordance with the imaging condition that is set by an operator, thereby acquiring magnetic resonance data from the subject. Then, the MRI apparatus 100 conducts image processing, such as Fourier transform process, on the acquired magnetic resonance data, thereby generating two-dimensional or three-dimensional image data.

The image storage apparatus 200 stores image data that is acquired by the MRI apparatus 100. Specifically, the image storage apparatus 200 acquires image data from the MRI apparatus 100 via the network 400 and stores the acquired image data in a memory circuitry that is provided inside or outside the apparatus. For example, the image storage apparatus 200 is implemented by a computer device, such as a server.

The image processing apparatus 300 processes image data that is acquired by the MRI apparatus 100. Specifically, the image processing apparatus 300 acquires image data from the MRI apparatus 100 or the image storage apparatus 200 via the network 400 and stores the acquired image data in a memory circuitry that is provided inside or outside the apparatus. Furthermore, the image processing apparatus 300 performs various types of image processing on the acquired image data and displays the image data, on which image processing has not been performed or on which image processing has been performed, on a display, or the like. For example, the image processing apparatus 300 is implemented by a computer device, such as workstation.

For example, as illustrated in FIG. 1, the image processing apparatus 300 includes interface (I/F) circuitry 310, memory circuitry 320, input circuitry 330, a display 340, and a processing circuitry 350.

The I/F circuitry 310 controls transmission of various types of data and communications that are transmitted and received between other apparatus, connected via the network 400, and the image processing apparatus 300. Specifically, the I/F circuitry 310 is connected to the processing circuitry 350 so that it converts the image data, output from the processing circuitry 350, into the format that is compatible with a predetermined communication protocol and transmits it to the MRI apparatus 100 or the image storage apparatus 200. Furthermore, the I/F circuitry 310 outputs the image data, received from the MRI apparatus 100 or the image storage apparatus 200, to the processing circuitry 350.

For example, the I/F circuitry 310 is implemented by a network card, a network adapter, or a network interface controller (NIC), or the like.

The memory circuitry 320 stores various types of data. Specifically, the memory circuitry 320 is connected to the processing circuitry 350 so that it stores input image data in accordance with commands, transmitted from the processing circuitry 350, or outputs stored image data to the processing circuitry 350. For example, the memory circuitry 320 is implemented by a semiconductor memory device, such as a random access memory (RAM) or a flash memory, a hard disk, an optical disk, or the like.

The input circuitry 330 receives input operations of various commands and various types of information from an operator. Specifically, the input circuitry 330 is connected to the processing circuitry 350 so that it converts the input operation, received from an operator, into electric signals and outputs them to the processing circuitry 350. For example, the input circuitry 330 is implemented by a trackball, a switch button, a mouse, a keyboard, a touch panel, or the like.

The display 340 displays various types of information and various images. Specifically, the display 340 is connected to the processing circuitry 350 so that it displays images in various formats on the basis of the image data that is output from the processing circuitry 350. For example, the display 340 is implemented by a liquid crystal monitor, a Cathode Ray Tube (CRT) monitor, a touch panel, or the like.

The processing circuitry 350 controls each component, included in the image processing apparatus 300, in accordance with input operations that are received from an operator via the input circuitry 330. Specifically, the processing circuitry 350 stores the image data, output from the I/F circuitry 310, in the memory circuitry 320. Furthermore, the processing circuitry 350 displays the image data, read from the memory circuitry 320, on the display 340. For example, the processing circuitry 350 is implemented by a processor.

With the above configuration, the image processing apparatus 300 according to the present embodiment has the function to generate images with any contrast through calculation after imaging by using the data that is acquired from the subject by the MRI apparatus 100.

Specifically, the image processing apparatus 300 has the function to derive the tissue quantitative value, such as the T1 value, the T2 value, or the proton density (PD) value, through simulation using the data, which is acquired by the MRI apparatus 100 while TI (Inversion Time) or TE (Echo Time) is changed, and to generate images with the contrast using any TI, TE, TR (Repetition Time) parameter on the basis of the derived tissue quantitative value.

For example, as the technology for generating images with any contrast after imaging through calculation, as described above, there is a known technology called Synthetic MRI, a technology called MR fingerprinting, or the like. For Synthetic MRI, tissue quantitative values are derived due to curve fitting or simulation using the theoretical formula for signal values of MRI images. Furthermore, for MR fingerprinting, tissue quantitative values are derived due to simulation through comparison with the database and estimation.

According to the above technology, through calculation, it is possible to generate images where the signal value of a specific tissue is suppressed, for example, fluid attenuated inversion recovery (FLAIR) images where the signal value of a tissue with a lot of water components, such as cerebrospinal fluid (CSF), is suppressed.

However, according to the above-described technology, tissue quantitative values are derived through simulation; therefore, there is a possibility that on generated images, the signal value of the tissue, which is the target to be suppressed, is not sufficiently suppressed.

Hence, the image processing apparatus 300 according to the present embodiment is configured to generate, from calculated images, the image where the tissue, which is the target to be suppressed, is suppressed more properly.

Furthermore, according to the present embodiment, an explanation is given of an example of the case where images are generated, on which the signal value of the CSF is suppressed, by using T2 weighted images of the head, generated through calculation.

Specifically, the processing circuitry 350 has an acquisition function 351, a first generation function 352, and a second generation function 353. Here, the first generation function 352 is an example of a first generating unit. Furthermore, the second generation function 353 is an example of a second generating unit.

The acquisition function 351 acquires, from the MRI apparatus 100 or the image storage apparatus 200, the data for calculated images, obtained during imaging for acquiring magnetic resonance signals that are used to derive a tissue quantitative value.

Specifically, the acquisition function 351 acquires, from the MRI apparatus 100, image data or magnetic resonance signal (magnetic resonance: MR) data on the subject, acquired while an imaging parameter, which affects the contrast of images, such as TI or TE, is changed.

The first generation function 352 uses the data that is obtained during imaging for acquiring magnetic resonance signals, which are used to derive a tissue quantitative value, to generate the first calculated image and the second calculated image, on which the signal values of the tissues other than the tissue, which is the target to be suppressed, are low as compared to the first calculated image, through calculation.

Specifically, the first generation function 352 has the function to derive a tissue quantitative value, such as the T1 value, the T2 value, or the PD value, through simulation using the data, acquired by the acquisition function 351, and to generate images with the contrast by using any TI, TE, or TR parameter in accordance with the derived tissue quantitative value. For example, the first generation function 352 generates the first calculated image and the second calculated image by using e technique, such as Synthetic MRI or MR fingerprinting.

According to the present embodiment, the first generation function 352 generates T2 weighted images through calculation as the first calculated image and the second calculated image. Specifically, the first generation function 352 uses the data, acquired by the acquisition function 351, to derive the T2 value through simulation on a pixel by pixel basis and generates the T2 weighted image on the basis of the derived T2 value.

Here, the first generation function 352 generates a T2 weighted image in a case where TE is TE1 as the first calculated image and generates a T2 weighted image in a case where TE is TE2, which is longer than TE1, as the second calculated image. Here, TE1 is the value of TE for adjusting the contrast of the first calculated image, and TE2 is the value of TE for adjusting the contrast of the second calculated image. For example, the first generation function 352 generates a T2 weighted image in a case where TE1=100 [ms] as the first calculated image and generates a T2 weighted image in a case where TE2=200 [ms] as the second calculated image.

That is, the first generation function 352 generates the first calculated image and the second calculated image that corresponds to TE, which is longer than TE of the first calculated image, through calculation.

Here, for example, the preset values, which are previously set, are used for TE1 and TE2. For example, TE1 and TE2 are input by an operator via the screen for setting prescribed values, and they are stored in the memory circuitry 320, or the like, in the form of prescribed-value setting file, or the like. In this case, the first generation function 352 refers to the setting file, stored in the memory circuitry 320, or the like, to generate the first calculated image and the second calculated image.

Figure 2A:
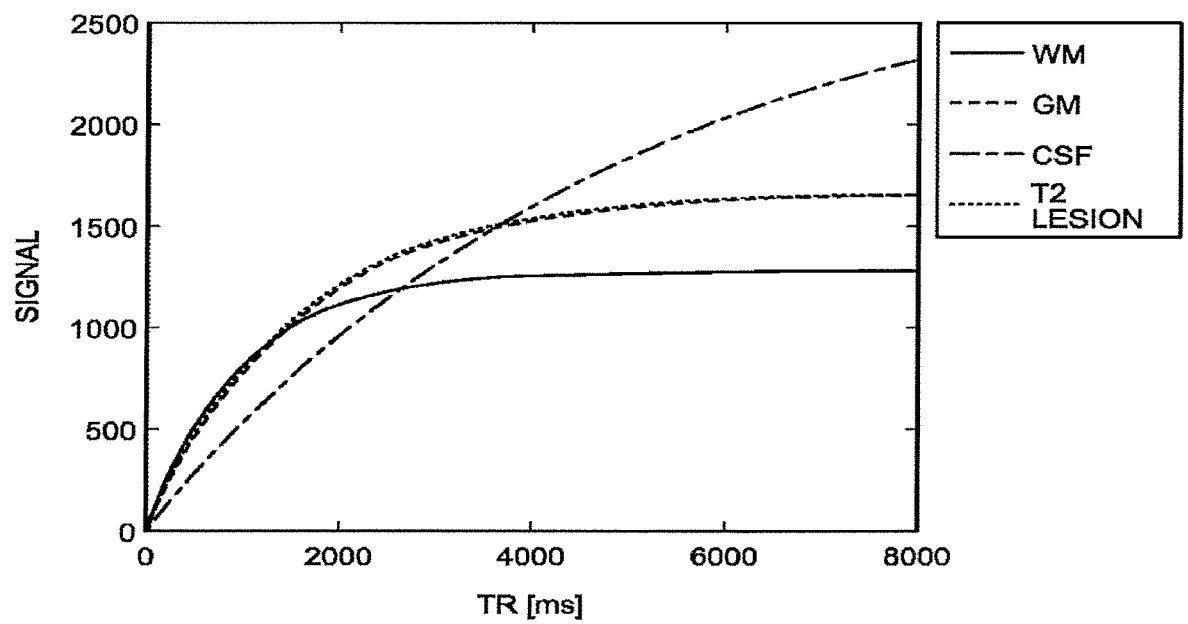
FIGS. 2A and 2B are diagrams that illustrate an example of generation of a T2 weighted image by a first generation function according to the first embodiment.
Figure 2B:
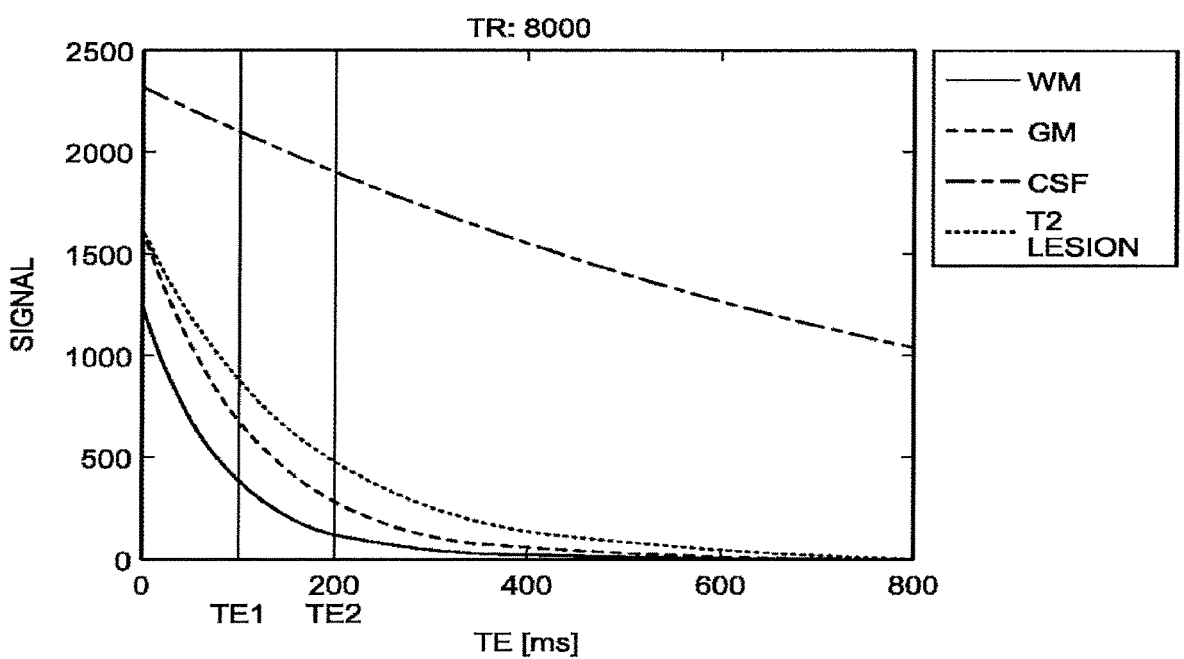

FIGS. 2A and 2B are diagrams that illustrate an example of generation of the T2 weighted image by the first generation function 352 according to the first embodiment. During simulation that is conducted by the first generation function 352, for example, as illustrated in FIG. 2A, the signal value of the T2 weighted image is derived with regard to each of the TRs. Furthermore, during the simulation that is conducted by the first generation function 352, for example, as illustrated in FIG. 2B, the signal value of the T2 weighted image is derived with regard to each of the TEs. Furthermore, the example illustrated in FIG. 2B is the example in a case where TR=8000 [ms].

Here, the example, illustrated in FIGS. 2A and 2B, indicates the signal values of the white matter (WM) of the brain, the gray matter (GM), the CSF, and the T2 lesion. For example, as illustrated in FIG. 2B, the signal value of each tissue, included in the T2 weighted image, decreases as the TE value increases in accordance with the T2 value of each tissue. Specifically, as the T2 value of a tissue is larger, the signal value of each tissue decreases more moderately in accordance with an increase in the TE value. Therefore, as the TE value increases, there is a larger difference between the signal value of a tissue with a small T2 value and the signal value of a tissue with a large T2 value.

For example, as illustrated in FIG. 2B, compared to other tissues, such as the WM, the GM, or the T2 lesion, the signal value of the CSF, which is the target to be suppressed according to the present embodiment, moderately decreases in accordance with an increase in the TE value because of a large T2 value. Therefore, if the degree of attenuation of the signal value of the CSF is compared with the degree of attenuation of the signal value of the tissue other than the CSF from the first calculated image to the second calculated image, the signal value of the tissue other than the CSF is attenuated more largely than the signal value of the CSF.

The second generation function 353 generates the difference image between the first calculated image and the second calculated image, thereby generating the image where the signal value of the tissue with a long relaxation time is suppressed.

For example, second generation function 353 subtracts the second calculated image from the first calculated image to generate a difference image, thereby generating the image where the signal value of the tissue with a long relaxation time is suppressed.

Specifically, the second generation function 353 uses the first calculated image and the second calculated image, generated by the first generation function 352, to generate the image where the signal value of the tissue with a long relaxation time is suppressed. Here, the second generation function 353 applies a weight to the signal value of the second calculated image such that the signal value of the tissue, which is the target to be suppressed, becomes the same on the first calculated image and the second calculated image, and it subtracts the second calculated image, to which a weight has been applied, from the first calculated image, thereby generating a difference image.

That is, when a difference image is generated, the second generation function 353 applies a weight such that the signal value of the suppression-target tissue on the first calculated image matches the signal value of the suppression-target tissue on the second calculated image.

For example, the second generation function 353 generates a difference image by using Equation (1) that is described below.

$$S = T2W(TE1) - T2W(TE2) * \exp((TE2 - TE1)/T2\text{ref}) \qquad (1)$$

In Equation (1), S denotes the signal value of each pixel on a difference image. Furthermore, T2W (TE1) denotes a T2 weighted image in a case where TE is TE1, i.e., the first calculated image, and T2W (TE2) denotes a T2 weighted image in a case where TE is TE2, i.e., the second calculated image. Furthermore, T2ref is the T2 value that is a coefficient for adjusting the weighting.

Here, for example, the preset value, which is previously set, is used for T2ref. For example, the value that is measured in a cerebral ventricle, or the like, or literature value is used for T2ref. For example, T2ref is input by an operator via the screen for setting the prescribed value, and it is stored in the memory circuitry 320, or the like, in the form of prescribed-value setting file, or the like. In this case, the second generation function 353 refers to the setting file, stored in the memory circuitry 320, or the like, to generate a difference image.

Specifically, T2ref is set to such a value that the signal value of the suppression-target tissue on the second calculated image, on which weighting has been conducted, matches the signal value of the suppression-target tissue on the first calculated image. As T2ref is set as described above, a difference image where the signal value of the suppression-target tissue is suppressed to zero may be generated by subtracting the second calculated image, on which weighting has been conducted, from the first calculated image.

For example, according the present embodiment, T2ref is set to such a value that signal value of the CSF on the second calculated image, on which weighting has been conducted, matches the signal value of the suppression-target tissue on the first calculated image. Thus, the second calculated image is subtracted from the first calculated image to generate a difference image, thereby generating a difference image where the signal value of the CSF, which is the target to be suppressed, is zero.

Here, according to the present embodiment, weighting is also conducted on the signal values of the tissues other than the CSF in the same manner as the signal value of the CSF; therefore, when a difference image is generated, the signal value is suppressed with regard to the tissues other than the CSF. Specifically, according to the present embodiment, the signal value of the tissue with the T2 value, which is closer to the CSF, is more suppressed. For example, the T2 lesion is suppressed more largely than the GM.

However, as described above, from the first calculated image to the second calculated image, the signal values of the tissues other than the CSF are attenuated more largely than the signal value of the CSF; therefore, the signal values of the tissues other than the CSF are less affected by suppression than the signal value of the CSF. Thus, with regard to the tissues other than the CSF, it is possible to obtain a difference image with the contrast of the T2 weighted image retained. Furthermore, if TE2 becomes longer, the signal values of the tissues other than the CSF becomes closer to zero on the second calculated image and therefore the contrast of the T2 weighted image on the difference image becomes higher as the gap between TE1 and TE2 is longer.

FIG. 3 is a diagram that illustrates an example of generation of a difference image by the second generation function 353 according to the first embodiment. Here, the diagram on the left side of FIG. 3 schematically illustrates a first calculated image 31, which is a T2 weighted image that is generated through calculation. Furthermore, the diagram in the middle of FIG. 3 schematically illustrates a second calculated image 32, on which weighting has been conducted, and which is a T2 weighted image that is generated through calculation. Furthermore, the diagram on the right side of FIG. 3 schematically illustrates a difference image 33 that is generated by subtracting the second calculated image 32, on which weighting has been conducted, from the first calculated image 31. Here, the first calculated image 31, the second calculated image 32, and the difference image 33, illustrated in FIG. 3, are axial images of the head that includes the brain.

For example, as illustrated in FIG. 3, on the first calculated image 31, a CSF 31a in the cerebral ventricles is rendered with a signal value that is higher than those of the tissues other than the CSF in the brain. Furthermore, on the second calculated image 32, a CSF 32a is rendered with a signal value that is the same as that of the CSF 31a on the first calculated image due to weighting, and the tissues other than the CSF 31a are rendered with a signal value that is lower than that on the first calculated image. Furthermore, on the difference image 33 that is generated by using the first calculated image 31 and the second calculated image 32, the signal value of a CSF 33a is suppressed to zero, and with regard to the tissues other than the CSF, the image is obtained in which the contrast of the T2 weighted image is retained.

Furthermore, although an explanation is given here of an example of the case where the second generation function 353 generates a difference image by subtracting the second calculated image from the first calculated image, embodiments are not limited thereto. For example, conversely, the second generation function 353 may generate a difference image by subtracting the first calculated image from the second calculated image.

Here, compared to the case where the second calculated image is subtracted from the first calculated image, in the case where the first calculated image is subtracted from the second calculated image, the signs of signal values on a difference image are inverted between positive and negative; however, it is possible to display the same image as that in the case where the second calculated image is subtracted from the first calculated image by further generating the image where the signs of signal values are inverted or by inverting allocation of the display color that corresponds to the levels of signal values.

Each of the functions, provided by the processing circuitry 350, is explained above, and these processing functions are stored in the memory circuitry 320 in the form of program executable by a computer, for example. The processing circuitry 350 reads each program from the memory circuitry 320 and executes each read program, thereby implementing the processing function that corresponds to each program. In other words, in a state where each program has been read, the processing circuitry 350 has each of the processing functions that are illustrated in FIG. 1.

Furthermore, although an explanation is given of an example of the case where each of the above-described processing functions is implemented by the single processing circuitry 350 in FIG. 1, embodiments are not limited thereto. For example, the processing circuitry 350 may be configured by combining multiple independent processors so that each of the processors executes each program to implement each processing function. Furthermore, each of the processing functions, provided by the processing circuitry 350, may be implemented by being appropriately distributed or integrated into one or more processing circuitries.

Figure 4:
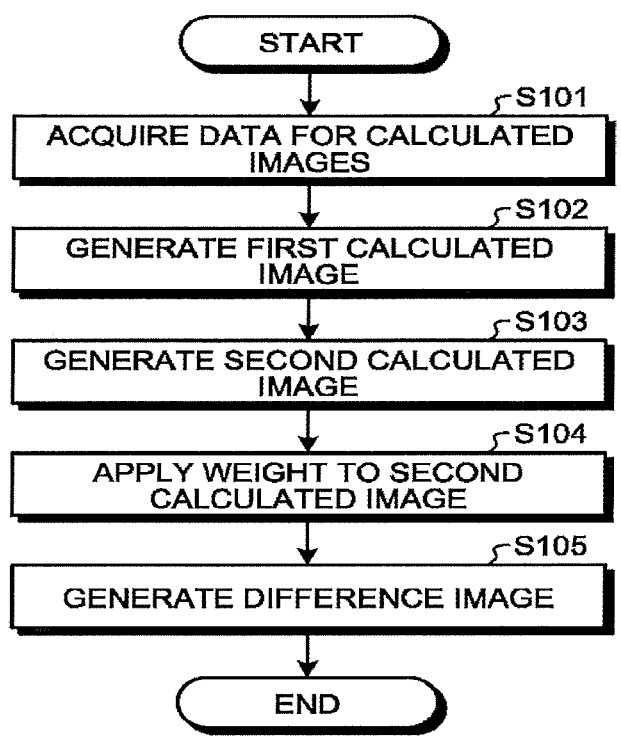
FIG. 4 is a flowchart that illustrates the steps of the process that is performed by the image processing apparatus according to the first embodiment.

FIG. 4 is a flowchart that illustrates the steps of the process that is performed by the image processing apparatus 300 according to the first embodiment. For example, as illustrated in FIG. 4, in the image processing apparatus 300 according to the present embodiment, the acquisition function 351 first acquires, from the PRI apparatus 100, the data for calculated images, obtained during imaging for acquiring magnetic resonance signals that are used to derive a tissue quantitative value (Step S101).

Then, the first generation function 352 generates the first calculated image by using the data that is obtained during imaging for acquiring magnetic resonance signals, which are used to derive a tissue quantitative value (Step S102). Furthermore, through calculation, the first generation function 352 generates the second calculated image where the signal values of the tissues other than the suppression-target tissue are low compared to the first calculated image (Step S103).

Then, the second generation function 353 applies a weight to the signal value of the second calculated image such that the signal value of the tissue, which is the target to be suppressed, becomes the same on the first calculated image and the second calculated image (Step S104). Then, the second generation function 353 subtracts the second calculated image, on which weighting has been conducted, from the first calculated image, thereby generating a difference image (Step S105). Furthermore, the generated difference image is displayed on the display 340 in accordance with for example a request from an operator.

Here, Step S101 is performed when for example the processing circuitry 350 invokes a predetermined program, which corresponds to the acquisition function 351, from the memory circuitry 320 and executes it. Furthermore, Step S102 to S103 are performed when for example the processing circuitry 350 invokes a predetermined program, which corresponds to the first generation function 352, from the memory circuitry 320 and executes it. Furthermore, Step S104 to S105 are performed when for example the processing circuitry 350 invokes a predetermined program, which corresponds to the second generation function 353, from the memory circuitry 320 and executes it.

Furthermore, in FIG. 4, the execution order of the operation (Step S102) to generate the first calculated image by the first generation function 352 and the operation (Step S103) to generate the second calculated image may be reversed.

As described above, according to the first embodiment, the second calculated image, which is a T2 weighted image in a case where TE is TE2 that is longer than TE1, is subtracted from the first calculated image, which is a T2 weighted image in a case where TE is TE1; thus, it is possible to obtain an image where the signal value of the CSF is suppressed to zero and, with regard to the tissues other than the CSF, the contrast of the T2 weighted image is retained. Thus, according to the first embodiment, it is possible to obtain an image that is close to the actually captured FLAIR image from the T2 weighted image that is generated through calculation. Therefore, according to the first embodiment, the image where the suppression-target tissue is suppressed more properly may be generated from the calculated image.

Furthermore, the above-described first embodiment may be appropriately deformed and implemented by changing part of the functions provided by the image processing apparatus 300. Therefore, a modification according to the first embodiment is explained below. Moreover, with regard to the following modification, the aspect different from the first embodiment is primarily explained, and detailed explanation for the same aspect as the first embodiment is omitted.

First Modification of the First Embodiment

First, although an explanation is given of an example of the case where a difference image is generated by using the T2 weighted image that is generated through calculation according to the above-described first embodiment, embodiments are not limited thereto. For example, a difference image may be generated by using a FLAIR image that is generated through calculation. Such an example is explained below as a first modification.

According to the present modification, the first generation function 352 generates FLAIR images as the first calculated image and the second calculated image through calculation.

Specifically, the first generation function 352 uses the data, acquired by the acquisition function 351, to derive the T2 value through simulation on a pixel by pixel basis and, in accordance with the derived T2 value, generates a FLAIR image. Here, the first generation function 352 generates a FLAIR image in a case where TE is TE1 as the first calculated image and generates a FLAIR image in a case where TE is TE2, which is longer than TE1, as the second calculated image. For example, the first generation function 352 generates a FLAIR image in a case where TE1=100 [ms] as the first calculated image and generates a FLAIR image in a case where TE2=200 [ms] as the second calculated image.

Figure 5A:
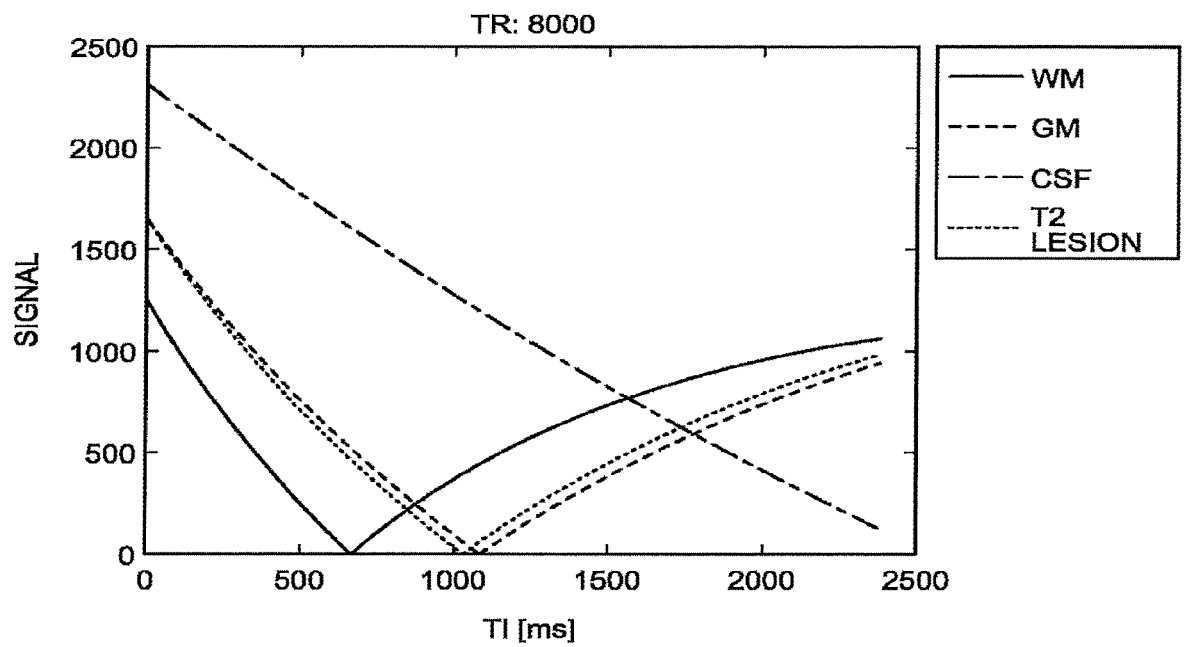
FIGS. 5A and 5B are diagrams that illustrate an example of generation of a FLAIR image by the first generation function according to a first modification of the first embodiment.
Figure 5B:
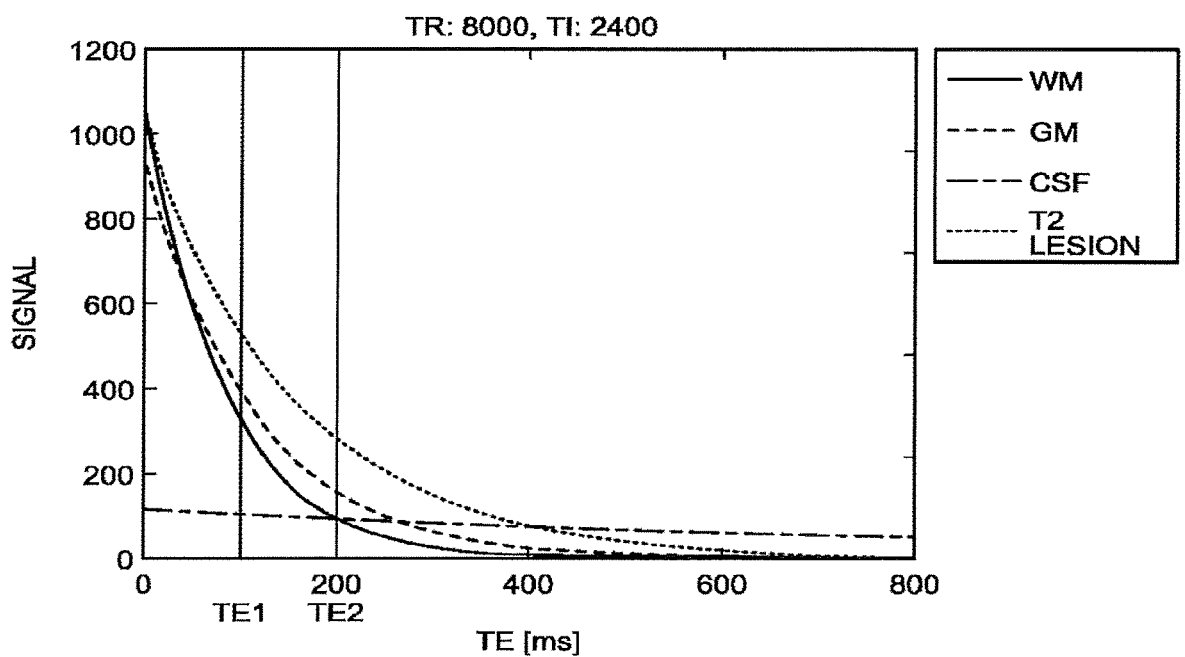

FIGS. 5A and 5B are diagrams that illustrate an example of generation of the FLAIR image by the first generation function 352 according to the first modification of the first embodiment. During the simulation that is conducted by the first generation function 352, the signal value of the FLAIR image is derived with regard to each of the TRs. Furthermore, during the simulation that is conducted by the first generation function 352, as illustrated in FIG. 5A, for example, the signal value of the FLAIR image is derived with regard to each of the TIs. Moreover, during the simulation that is conducted by the first generation function 352, as illustrated in FIG. 5B, for example, the signal value of the FLAIR image is derived with regard to each of the TEs. Here, the example, illustrated in FIG. 5B, represents an example of the case where TR=8000 and TI=2400 [ms].

Here, the example, illustrated in FIGS. 5A and 5B, indicates the signal values of the white matter (WM) of the brain, the gray matter (GM), the CSF, and the T2 lesion, as is the case with the example that is illustrated in FIG. 2. For example, as illustrated in FIG. 2B, in the case of the FLAIR image, as is the case with the T2 weighted image, the signal value of each tissue decreases as the TE value increases in accordance with the T2 value of each tissue. However, in the case of the FLAIR image, the derived signal value of the CSF is suppressed in whole, as compared to the case of the T2 weighted image.

Then, according to the present modification, the second generation function 353 generates a difference image by using the following Equation (2).

$$S=\text{FLAIR}(TE1)-\text{FLAIR}(TE2)*\exp((TE2-TE1)/T2\text{ref}) \quad (2)$$

In Equation (2), S denotes the signal value of each pixel a difference image. Furthermore, FLAIR (TE1) denotes a FLAIR image in a case where TE is TE1, i.e., the first calculated image, and FLAIR (TE2) denotes a FLAIR image in a case where TE is TE2, i.e., the second calculated image. Furthermore, T2ref is the T2 value that is a coefficient for adjusting the weighting.

According to the present modification, too, for example, T2ref is set to such a value that the signal value of the CSF on the second calculated image, on which weighting has been conducted, matches the signal value of the suppression-target tissue on the first calculated image. Thus, a difference image is generated by subtracting the second calculated image from the first calculated image, thereby generating a difference image where the signal value of the CSF, which is the target to be suppressed, is zero.

Here, according to the present modification, too, a weight is applied to the signal values of the tissues other than the CSF in the same manner as the signal value of the CSF; therefore, when a difference image is generated, the signal value is also suppressed with regard to the tissues other than the CSF. Specifically, according to the present modification, the signal value is ore suppressed for the tissue that has a smaller change in the signal value in a case where TE is TE1 and in a case where TE is TE2. For example, T2 lesion is suppressed to the same degree as the GM.

However, with regard to FLAIR images, as is the case with T2 weighted images, the signal values of the tissues other than the CSF are attenuated more largely than the signal value of the CSF from the first calculated image to the second calculated image; therefore, the signal values of the tissues other than the CSF are less affected by suppression as compared to the signal value of the CSF. Thus, according to the present modification, too, with regard to the tissues other than the CSF, a difference image is obtained in which the contrast of the T2 weighted image is retained. Furthermore, according to the present modification, too, if TE2 becomes longer, the signal values of the tissues other than the CSF becomes closer to zero on the second calculated image; therefore, the contrast of the T2 weighted image on the difference image becomes higher as the gap between TE1 and TE2 becomes longer.

FIG. 6 is a diagram that illustrates an example of generation of a difference image by the second generation function 353 according to the first modification of the first embodiment. Here, the diagram on the left side of FIG. 6 schematically illustrates a first calculated image 61, which is a FLAIR image that is generated through calculation. Furthermore, the diagram in the middle of FIG. 6 schematically illustrates a second calculated image 62, which is a FLAIR image that is generated through calculation and on which weighting has been conducted. Moreover, the diagram on the right side of FIG. 6 schematically illustrates a difference image 63 that is generated by subtracting the second calculated image 62, on which weighting has been conducted, from the first calculated image 61. Here, the first calculated image 61, the second calculated image 62, and the difference image 63, illustrated in FIG. 6, are axial images of the head that includes the brain.

For example, as illustrated in FIG. 6, on the first calculated image 61, a CSF 61a in the cerebral ventricles is rendered with a suppressed signal value. Furthermore, on the second calculated image 62, a CSF 62a is rendered with the same signal value as the CSF 61a on the first calculated image due to weighting. Furthermore, the difference image 63, which is generated by using the first calculated image 61 and the second calculated image 62, is an image where the signal value of a CSF 63a is suppressed to zero and the contrast of the T2 weighted image is retained with regard to the tissues other than the CSF.

In this way, according to the first modification, the second calculated image, which is a FLAIR image in a case where TE is TE2 that is longer than TE1, is subtracted from the first calculated image, which is a FLAIR image in a case where TE is TE1, so that an image may be obtained in which the contrast of the T2 weighted image is retained for the tissues other than the CSF and the signal value of the CSF is suppressed to zero. As described above, if FLAIR images are used as the first calculated image and the second calculated image, an image with the signal value of the CSF already suppressed is used before a difference image is generated. However, as described above, if a tissue quantitative value is derived through simulation, there is a possibility that the signal value of the CSF is not sufficiently suppressed on the generated image. According to the first modification, even in such a case, an image may be obtained in which the signal value of the CSF is suppressed to zero, and therefore an image that is close to the actually captured FLAIR image may be obtained.

Second Modification of the First Embodiment

Furthermore, in the above-described first embodiment, an explanation is given of an example of the case where a weight is applied to the signal value of the second calculated image; however, embodiments are not limited thereto. For example, if there is no need for the high accuracy of suppression of the signal value with regard to the suppression-target tissue, a difference image may be generated without applying a weight to the second calculated image. Hereinafter, this example is explained as a second modification.

According to the present modification, the first generation function 352 generates FLAIR images as the first calculated image and the second calculated image through calculation as is the case with the above-described first modification.

Furthermore, according to the present modification, the second generation function 353 generates a difference image by using the following Equation (3).

$$S = \text{FLAIR}(TE1) - \text{FLAIR}(TE2) \quad (3)$$

In Equation (3), S denotes the signal value of each pixel on a difference image. Furthermore, FLAIR (TE1) denotes a FLAIR image in a case where TE is TE1, i.e., the first calculated image, and FLAIR (TE2) denotes a FLAIR image in a case where TE is TE2, i.e., the second calculated image.

In this way, if FLAIR images are used as the first calculated image and the second calculated image, the signal value of the CSF has been already suppressed to some extent before a difference image is generated. Therefore, without applying any weight to the signal value of the second calculated image, a difference image may be obtained in which the signal value of the CSF is sufficiently suppressed.

In this way, according to the second modification, the second calculated image, which is a FLAIR image in a case where TE is TE2 that is longer than TE1, is subtracted from the first calculated image, which is a FLAIR image in a case where TE is TE1, so that an image may be obtained in which the signal value of the CSF is suppressed and the contrast of the T2 weighted image is retained for the tissues other than the CSF.

Third Modification of the First Embodiment

Furthermore, in the above-described first embodiment and modifications, an explanation is given of an example of the case where the preset values, which are previously set, are used as the TE values of TE1 and TE2, used by the first generation function 352, and the value of T2ref, used by the second generation function 353; however, embodiments are not limited thereto. For example, if operations to input the values of the parameter used for calculation and the parameter used for weighting are received from an operator, each of the parameters may be set or changed. Such a case is explained below as a third modification.

According to the present modification, the first generation function 352 receives an operation to input the parameter values used for calculation from an operator and, in accordance with the input parameter values, generates the first calculated image and the second calculated image. Here, for example, the parameter values used for calculation are the values of TE for adjusting the contrasts of the first calculated image and the second calculated image. Specifically, the parameter values, mentioned here, are TE1 and TE2.

Figure 7:
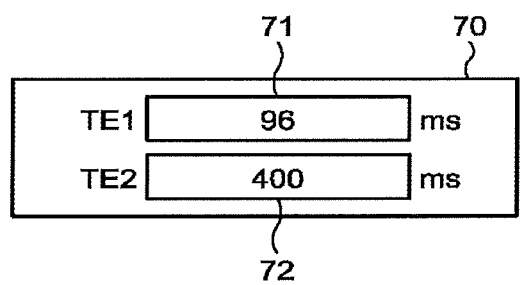
FIG. 7 is a diagram that illustrates an example of the user interface according to a third modification of the first embodiment.

FIG. 7 is a diagram that illustrates an example of the user interface according to the third modification of the first embodiment. For example, as illustrated in FIG. 7, the first generation function 352 displays a user interface 70, including a first text box 71 and a second text box 72, which is a graphical user interface (GUI) for inputting numerical values, on the display 340 in accordance with a request from an operator. The first text box 71 is a text box for inputting the value of TE1, and the second text box 72 is a text box for inputting the value of TE2. Furthermore, the first generation function 352 generates the first calculated image by using TE1 that is input by the operator using the first text box 71, and it generates the second calculated image by using TE2 that is input by the operator using the second text box 72.

Figure 8:
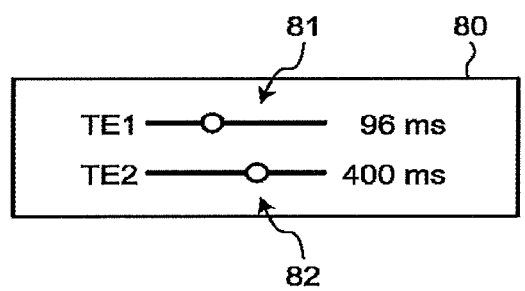
FIG. 8 is a diagram that illustrates an example of the user interface according to the third modification of the first embodiment.

FIG. 8 is a diagram that illustrates an example of the user interface according to the third modification of the first embodiment. For example, as illustrated in FIG. 8, the first generation function 352 may display a user interface 80, including a first slider 81 and a second slider 82, which is a GUI for specifying or adjusting numerical values, on the display 340. The first slider 81 is a slider for specifying or adjusting the value of TE1, and the second slider 82 is a slider for specifying or adjusting the value of TE2. Furthermore, the first generation function 352 generates the first calculated image by using TE1 that is specified or adjusted by an operator using the first slider 81, and it generates the second calculated image by using TE2 that is specified or adjusted by an operator using the second slider 82.

Furthermore, according to the present modification, the second generation function 353 receives an operation to input the parameter value, used for applying a weight to the second calculated image, from an operator and, in accordance with the input parameter value, generates a difference image. Here, for example, the parameter value, used for applying a weight to the second calculated image, is the T2 value that is a coefficient for adjusting the weighting. Specifically, the parameter value, mentioned here, is T2ref that is represented by Equation (1) or Equation (2).

Figure 9:
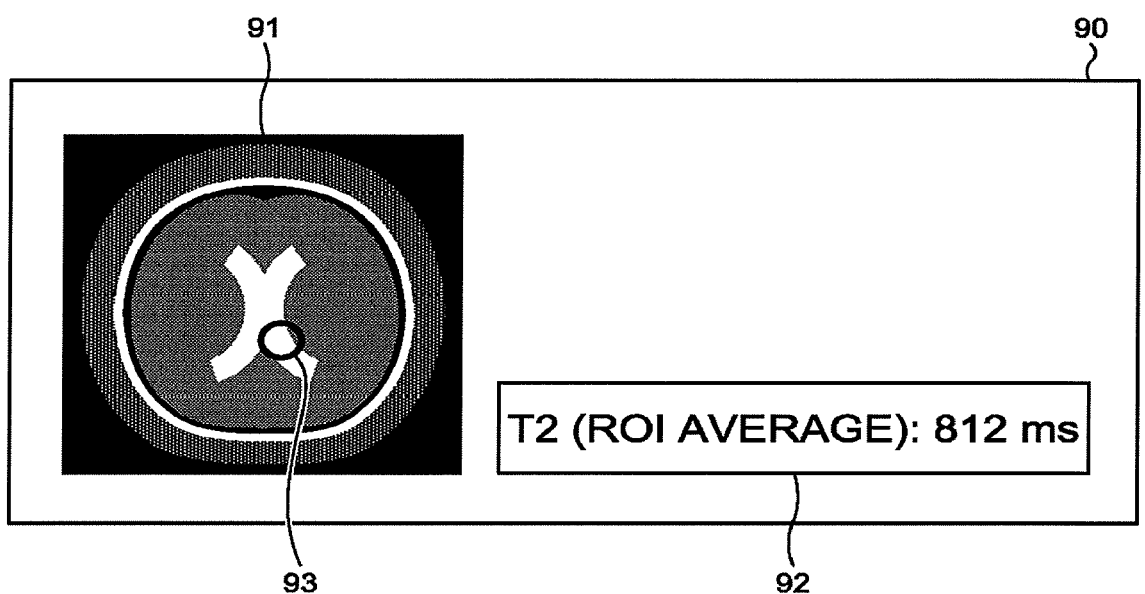
FIG. 9 is a diagram that illustrates an example of the user interface according to the third modification of the first embodiment.

FIG. 9 is a diagram that illustrates an example of the user interface according to the third modification of the first embodiment. For example, as illustrated in FIG. 9, in accordance with a request from an operator, the second generation function 353 displays a user interface 90, including a first area 91 for displaying the T2 map image, on which the T2 value is stored in each pixel, and a second area 92 for displaying the value of T2ref, on the display 340.

For example, in accordance with a request from an operator, the second generation function 353 displays, on the first area 91, the T2 map image that is generated from the same data as the data on which the first calculated image and the second calculated image are based. Then, the second generation function 353 receives an operation to designate a region of interest 93 on the T2 map image from an operator. Here, for example, the region of interest 93 is represented by using a circular graphic. Here, the shape of the graphic that represents the region of interest 93 is not limited to a circle, and it may be for example a rectangle.

Then, after the region of interest 93 is designated by the operator, the second generation function 353 sets T2ref on the basis of the pixel values that are included in the region of interest 93 on the T2 map image. For example, the second generation function 353 calculates the average value of the pixel values, included in the region of interest 93, and sets the calculated average value as T2ref. Here, the second generation function 353 displays the calculated average value of the pixel values on the second area 92. Then, the second generation function 353 uses the set T2ref to generate a difference image based on Equation (1) or Equation (2).

In this way, according to the third modification, by using the user interface for setting the region of interest on the T2 map image, a difference image is automatically generated by conducting weighting such that the pixel value in the section, on which the region of interest is designated, becomes zero. Therefore, with simple operation, it is possible to generate images where the suppression-target tissue is suppressed more properly from calculated images.

Furthermore, for example, the second generation function 353 may display a GUI, such as the same text box as that in the example illustrated in FIG. 7 or the same slider as that in the example illustrated in FIG. 8, to receive an operation to input the numerical value that indicates T2ref from an operator.

Specifically, according to the modification that is illustrated in FIG. 9, weighting is determined on the basis of the T2 relaxation curved line of the suppression-target tissue, calculated by using the data that is used to generate the first calculated image and the second calculated image.

For example, during imaging to acquire magnetic resonance signals that are used to derive a tissue quantitative value, predetermined imaging sequences are conducted to perform data acquisition for generating a T1 map image and data acquisition for generating a T2 map image, respectively. The first generation function 352 uses the data that is acquired during the data acquisition for generating the T1 map image to derive a T1 relaxation curved line through simulation, thereby generating the T1 map image. Furthermore, the first generation function 352 uses the data that is acquired during the data acquisition for generating a T2 map image to derive a T2 relaxation curved line through simulation, thereby generating a T2 map image. Furthermore, the first generation function 352 may generate PD images from the T1 map image and the T2 map image.

According to the modification illustrated in FIG. 9, T2ref is set by using the T2 map image that is generated by the first generation function 352 as described above. Furthermore, in the modification illustrated in FIG. 9, an explanation is given of an example of the case where the region of interest is set in accordance with an operation by the operator; however, the method for setting the region of interest is not limited thereto. For example, the second generation function 353 may use a technology, such as segmentation, to detect the area that includes the CSF in cerebral ventricles, or the like, on the T2 map image and set the detected area as the region of interest. In this case, the value of T2ref, used for weighting, may be automatically set.

Fourth Modification of the First Embodiment

Furthermore, in the above-described first embodiment and modifications, an explanation is given of an example of the case where the image, on which the signal value of the CSF is suppressed, is generated; however, embodiments are not limited thereto. For example, an image may be generated, in which the signal value of a specific tissue other than the CSF is suppressed. Such an example is explained below as a fourth modification.

Specifically, according to the fourth modification, T2ref is set to such a value that the signal value of a specific tissue other than the CSF on the second calculated image, on which weighting has been conducted, matches the signal value of the specific tissue on the first calculated image. Thus, according to the present modification, the second generation function 353 generates a difference image by subtracting the second calculated image from the first calculated image, thereby generating a difference image on which the signal value of a specific tissue other than the CSF is zero.

Second Embodiment

Furthermore, in the above-described first embodiment, the embodiment of the image processing apparatus is explained; however, embodiment are not limited thereto. For example, the technology disclosed in the subject application may be implemented by an MRI apparatus. An embodiment of the MRI apparatus is explained below as a second embodiment.

Figure 10:
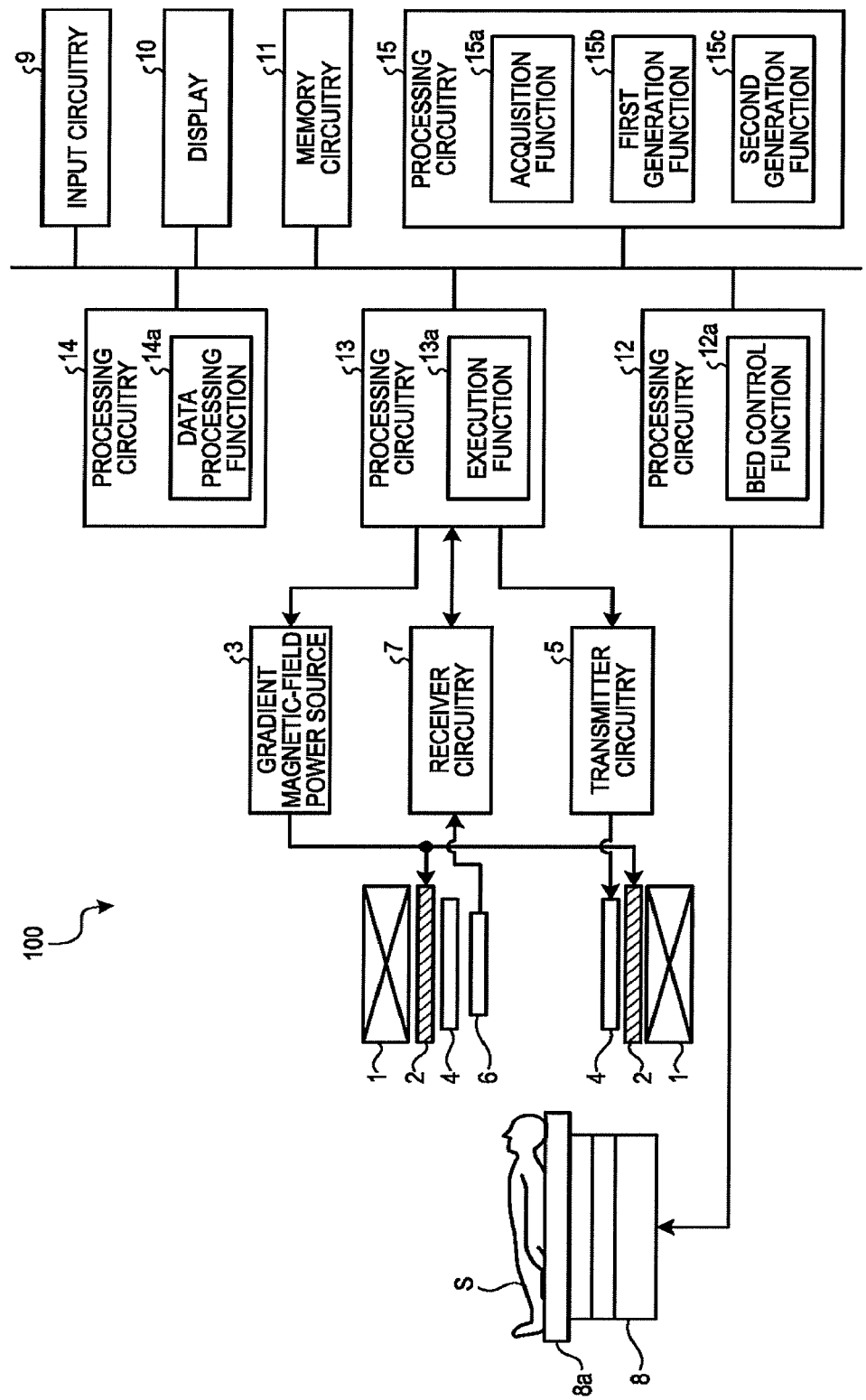
FIG. 10 is a diagram that illustrates an example of the configuration of an MRI apparatus according to the second embodiment.

FIG. 10 is a diagram that illustrates an example of the configuration of an MRI apparatus 100 according to the second embodiment. For example, as illustrated in FIG. 10, the MRI apparatus 100 includes a static magnetic field magnet 1, a gradient coil 2, a gradient magnetic field power source 3, a transmitter coil 4, transmitter circuitry 5, a receiver coil 6, receiver circuitry 7, a couch 5, input circuitry 9, a display 10, memory circuitry 11, and processing circuitries 12 to 15.

The static magnetic field magnet 1 is formed into a substantially cylindrical shape (including the one that has an elliptical shape in cross-section perpendicular to the central axis of the cylinder) with a hollow, and it generates a uniform static magnetic field in the imaging space that is formed on the inner circumference side. For example, the static magnetic field magnet 1 is implemented by a permanent magnet, a superconductive magnet, or the like.

The gradient coil 2 is formed into a substantially cylindrical shape (including the one that has an elliptical shape in cross-section perpendicular to the central axis of the cylinder) with a hollow, and it is located on the inner circumference side of the static magnetic field magnet 1. The gradient coil 2 includes three coils that generate gradient magnetic fields along the x axis, the y axis, and the z axis, which run at right angles to one another. Here, the x axis, the y axis, and the z axis constitute the apparatus coordinate system that is unique to the MRI apparatus 100. For example, the direction of the x axis is set in the vertical direction, and the direction of the y axis is set in the horizontal direction. Furthermore, the direction of the z axis is set in the same direction as that of the magnetic flux of the static magnetic field that is generated by the static magnetic field magnet 1.

The gradient magnetic field power source 3 individually supplies the current to each of the three coils, included in the gradient coil 2, thereby generating a gradient magnetic field in the imaging space along each of the x axis, the y axis, and the z axis. By generating a gradient magnetic field along each of the x axis, the y axis, and the z axis as appropriate, gradient magnetic fields may be generated along a read-out direction, a phase encode direction, and a slice direction, which are perpendicular to one another. Here, the axes along the read-out direction, the phase encode direction, and the slice direction constitute a logical coordinate system that defines a slice area or a volume area, which is the target to be imaged. Furthermore, hereinafter, the gradient magnetic field along the read-out direction is referred to as a read-out gradient magnetic field, a gradient magnetic field along the phase encode direction is referred to as a phase-encode gradient magnetic field, and the gradient magnetic field along the slice direction is referred to as the slice gradient magnetic field.

Here, each of the gradient magnetic fields is overlapped with a static magnetic field that is generated by the static magnetic field magnet 1, and it is used to give spatial positional information to magnetic resonance signals (magnetic resonance: MR). Specifically, the read-out gradient magnetic field changes the frequency of the MR signal in accordance with the position in the read-cut direction so as to give the positional information along the read-out direction to the MR signal. Furthermore, the phase-encode gradient magnetic field changes the phase of the MR signal along the phase encode direction so as to give the positional information in the phase encode direction to the MR signal. Furthermore, the slice gradient magnetic field is used to determine the direction of a slice area, the thickness, or the number of pieces if the imaging area is a slice area and, if the imaging area is a volume area, it changes the phase of the MR signal in accordance with the position in the slice direction so as to give the positional information along the slice direction to the MR signal.

The transmitter coil 4 is formed into a substantially cylindrical shape (including the one that has an elliptical shape in cross-section perpendicular to the central axis of the cylinder) with a hollow, and it is located inside the gradient coil 2. The transmitter coil 4 applies radio frequency (RF) pulses, output from the transmitter circuitry 5, to the imaging space.

The transmitter circuitry 5 outputs RF pulses, which correspond to the Larmor frequency, to the transmitter coil 4. For example, the transmitter circuitry 5 includes an oscillation circuit, a phase selection circuit, a frequency conversion circuit, an amplitude modulation circuit, and an RF amplification circuit. The oscillation circuit generates RF pulses at the resonant frequency that is unique to the target atomic nucleus, which is placed in the static magnetic field. The phase selection circuit selects the phase of the RF pulse that is output from the oscillation circuit. The frequency conversion circuit converts the frequency of the RF pulse that is output from the phase selection circuit. The amplitude modulation circuit modulates the amplitude of the RF pulse, output from the frequency conversion circuit, in accordance with for example sing function. The RE amplification circuit amplifies the RF pulse, output from the amplitude modulation circuit, and outputs it to the transmitter coil 4.

The receiver circuitry 7 generates MR signal data on the basis of the MR signal, output from the receiver coil 6, and outputs the generated MR signal data to the processing circuitry 13. For example, the receiver circuitry 7 includes a selection circuit, a former-stage amplification circuit, a phase detection circuit, and an analog-digital conversion circuit. The selection circuit selectively inputs MR signals that are output from the receiver coil 6. The former-stage amplification circuit amplifies MR signals that are output from the selection circuit. The phase detection circuit detects the phase of the MR signal that is output from the former-stage amplification circuit. The analog-digital conversion circuit converts analog signals, output from the phase detection circuit, into digital signals to generate MR signal data, and it outputs the generated MR signal data to the processing circuitry 13.

Furthermore, an explanation is given here of an example of the case where the transmitter coil 4 applies RE pulses and the receiver coil 6 receives R signals; however, the configurations of the transmitter coil 4 and the receiver coil 6 are not limited thereto. For example, the transmitter coil 4 may further have a receiving function to receive MR signals. Furthermore, the receiver coil 6 may further have a transmitting function to apply an RF magnetic field. If the transmitter coil 4 has a receiving function, the receiver circuitry 7 also generates MR signal data from MR signals that are received by the transmitter coil 4. Furthermore, if the receiver coil 6 has a transmitting function, the transmitter circuitry 5 also outputs RE pulses to the receiver coil 6.

The couch 8 includes a couchtop 8a, on which the subject S is placed and, when capturing is conducted on the subject S, it inserts the couchtop 8a into the imaging space that is formed inside the static magnetic field magnet 1 and the gradient coil 2. For example, the couch 8 is arranged such that its longitudinal direction is parallel to the central axis of the static magnetic field magnet 1.

The input circuitry 9 receives input operations of various commands and various types of information from an operator. Specifically, the input circuitry 9 is connected to the processing circuitry 15 so that it converts the input operation, received from an operator, into an electric signal and outputs it to the processing circuitry 15. For example, the input circuitry 9 is implemented by a trackball, a switch button, a mouse, a keyboard, a touch panel, or the like.

The display 10 displays various types of information and various images. Specifically, the display 10 is connected to the processing circuitry 15 so that it converts the data on various types of information and various images, transmitted from the processing circuitry 15, into electric signals for display and outputs them. For example, the display 10 is implemented by a liquid crystal monitor, a cathode ray tube (CRT) monitor, a touch panel, or the like.

The memory circuitry 11 stores various types of data. Specifically, the memory circuitry 11 stores MR signal data or image data for each of the subjects S. For example, the memory circuitry 11 is implemented by a semiconductor memory device, such as a random access memory (RAM) or a flash memory, a hard disk, an optical disk, or the like.

The processing circuitry 12 has a bed control function 12a. Specifically, the bed control function 12a is connected to the couch 8 so that it outputs electric signals for control to the couch 8, thereby controlling operations of the couch 8. For example, the bed control function 12a receives a command to move the couchtop 8a in the longitudinal direction, the vertical direction, or the horizontal direction from an operator via the input circuitry 9, and it operates a driving mechanism for t couchtop 8a, included in the couch 8, to move the couchtop 8a in accordance with the received command. For example, the processing circuitry 12 is implemented by a processor.

The processing circuitry 13 has an execution function 13a. Specifically, the execution function 13a conducts various pulse sequences. That is, the execution function 13a drives the gradient magnetic field power source 3, the transmitter circuitry 5, and the receiver circuitry 7 on the basis of the sequence execution data, output from the processing circuitry 15, thereby conducting various pulse sequences. For example, the processing circuitry 13 is implemented by a processor.

Here, the sequence execution data is the information that defines the pulse sequence that indicates the procedure for acquiring MR signal data. Specifically, the sequence execution data is the information that defines the timing in which the gradient magnetic field power source 3 supplies current to the gradient coil 2 and the level of the supplied current, the level of the RF pulse current, which is supplied to the transmitter coil 4 by the transmitter circuitry 5 and the supply timing, the detection timing in which the receiver circuitry 7 detects MR signals, or the like.

Furthermore, as a result of execution of various pulse sequences, the execution function 13a receives MR signal data from the receiver circuitry 7 and stores the received MR signal data in the memory circuitry 11. Furthermore, the set of MR signal data, received by the execution function 13a, is arranged in two dimensions or three dimensions in accordance with the positional information, which is given by the read-out gradient magnetic field, the phase-encode gradient magnetic field, and the slice gradient magnetic field, described above, so that it is stored as the data that forms the k space in the memory circuitry 11.

The processing circuitry 14 has a data processing function 14a. For example, the processing circuitry 14 is implemented by a processor. The data processing function 14a generates images on the basis of the MR signal data that is stored in the memory circuitry 11. Specifically, the data processing function 14a reads the MR signal data that is stored in the memory circuitry 11 by the execution function 13a and performs post-processing, i.e., reconstruction process, such as Fourier transform, on the read MR signal data to generate images. Furthermore, the data processing function 14a stores the image data on the generated image in the memory circuitry 11.

The processing circuitry 15 controls each component included in the MRI apparatus 100, thereby performing the overall control on the MRI apparatus 100. For example, the processing circuitry 15 is implemented by a processor. For example, the processing circuitry 15 receives inputs of various parameters with regard to the pulse sequence from an operator via the input circuitry 9 and, in accordance with the received parameter, generates sequence execution data. Then, the processing circuitry 15 transmits the generated sequence execution data to the processing circuitry 13, thereby conducting various pulse sequences. Furthermore, for example, the processing circuitry 15 reads the image data on an image, which is requested by an operator, from the memory circuitry 11 and outputs the read image to the display 10.

With the above configuration, the MRI apparatus 100 according to the present embodiment has a function to generate images with any contrast through calculation after imaging by using the data that is acquired from the subject S. Furthermore, the MRI apparatus 100 is configured to generate, from calculated images, images where the suppression-target tissue is suppressed more properly, as is the case with the image processing apparatus 300 that is explained in the first embodiment.

Specifically, the processing circuitry 15 includes an acquisition function 15a, a first generation function 15b, and a second generation function 15c.

The acquisition function 15a has the same functionality as the acquisition function 351 that is explained in the first embodiment or the modification that is described above. However, although the acquisition function 351 acquires data for calculated images from the MRI apparatus 100 or the image storage apparatus 200 according to the above-described first embodiment, the acquisition function 15a according to the present embodiment acquires data for calculated images from the memory circuitry 11.

The first generation function 15b has the same functionality as the first generation function 352 that is explained in the first embodiment or the modification that is described above.

The second generation function 15c has the same functionality as the second generation function 353 that is explained in the first embodiment or the modification that is described above.

Furthermore, according to the present embodiment, the input circuitry 9, the display 10, and the memory circuitry 11 further have the functionalities that are provided by the input circuitry 330, the display 340, and the memory circuitry 320 that are explained in the above-described first embodiment.

Each of the processing functions, provided by the processing circuitry 15, is explained above. Here, for example, each of the above-described processing functions is stored in the memory circuitry 11 in the form of program executable by a computer. The processing circuitry 15 reads each program from the memory circuitry 11 and executes each read program so as to implement the processing function that corresponds to each program. In other words, in a state where each program has been read, the processing circuitry 15 has each of the processing functions that are illustrated in FIG. 10.

Furthermore, in FIG. 10, an explanation is given of an example of the case where each of the above-described processing functions is implemented by the single processing circuitry 15; however, embodiments are not limited thereto. For example, the processing circuitry 15 may be configured by combining independent processors, and each of the processors may execute each program to implement each processing function. Furthermore, each processing function, provided by the processing circuitry 15, may be implemented by being separated or integrated into one or more processing circuitries as appropriate.

With the above configuration, according to the second embodiment, it is possible to generate images where the suppression-target tissue is suppressed more properly from calculated images, as is the case with the first embodiment and the modification that are described above.

The term of the "processer", used in the above explanation, means for example a central processing unit (CPU), a graphical processing unit (GPU), or a circuit, such as an application specific integrated circuit (ASIC) or a programmable logic device (e.g., a simple programmable logic device (SPLD), a complex programmable logic device (CPLD), or a field programmable gate array (FPGA)). Here, a configuration may be such that, instead of storing programs in the memory circuitry, a program is directly installed in a circuit of the processor. In this case, the processor reads and executes a program that is installed in the circuit to implement the function. Furthermore, each processor according to the present embodiment is not always configured as a single circuit for each processor, and multiple separate circuits may be combined to be configured as a single processor so as to perform the function.

According to at least one of the above-described embodiments, it is possible to generate images where the suppression-target tissue is suppressed more properly from calculated images.

Although some embodiments according to the present invention are explained, the embodiments are presented as examples, and there is no intension to limit the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image processing apparatus, comprising:
processing circuitry configured to
  generate a first calculated image and a second calculated image through simulation using the same data obtained through an imaging in which magnetic resonance signals used for deriving a tissue quantitative value are acquired, wherein a signal value of a tissue other than a suppression-target tissue, which is a target to be suppressed, is low on the second calculated image as compared to the first calculated image, and
  make a signal value of the suppression-target tissue on the first calculated image substantially match a signal value of the suppression-target tissue on the second calculated image and thereafter generate a difference image between the first calculated image and the second calculated image so as to generate an image on which a signal value of a tissue with a long relaxation time is suppressed.

2. The image processing apparatus according to claim 1, wherein the processing circuitry is further configured to
  generate, through the simulation, the first calculated image and the second calculated image corresponding to a TE that is longer than a TE of the first calculated image, and
  generate the difference image between the first calculated image and the second calculated image.

3. The image processing apparatus according to claim 1, wherein the processing circuitry is further configured to, when generating the difference image, conduct weighting such that the signal value of the suppression-target tissue on the first calculated image matches the signal value of the suppression-target tissue on the second calculated image.

4. The image processing apparatus according to claim 3, wherein the weighting is determined by the processing circuitry in accordance with a T2 relaxation curved line of the suppression-target tissue, calculated by using the data.

5. The image processing apparatus according to claim 3, wherein the processing circuitry is further configured to
  receive an operation to input a parameter value, which is used for the weighting, from an operator, and
  generate the difference image in accordance with the input parameter value.

6. The image processing apparatus according to claim 5, wherein the parameter value used for the weighting by the processing circuitry is a T2 value that is a coefficient for adjusting the weighting.

7. The image processing apparatus according to claim 5, wherein the processing circuitry is further configured to
  display, on a display, a T2 map image having a T2 value in each pixel,
  receive an operation to designate a region of interest on the T2 map image from the operator, and
  set the parameter value based on a pixel value included in the region of interest.

8. The image processing apparatus according to claim 1, wherein the processing circuitry is further configured to generate T2 weighted images as the first calculated image and the second calculated image through the simulation.

9. The image processing apparatus according to claim 1, wherein the processing circuitry is further configured to generate fluid attenuated inversion recovery (FLAIR) images as the first calculated image and the second calculated image through the simulation.

10. The image processing apparatus according to claim 1, wherein the processing circuitry is further configured to
  receive an operation to input a parameter value, which is used for the simulation, from an operator, and
  generate the first calculated image and the second calculated image in accordance with the input parameter value.

11. The image processing apparatus according to claim 10, wherein the parameter value used for the simulation by the processing circuitry is a value of TE for adjusting contrast of the first calculated image and the second calculated image.

* * * * *